(12) United States Patent
Song

(10) Patent No.: US 9,312,000 B1
(45) Date of Patent: Apr. 12, 2016

(54) SEMICONDUCTOR APPARATUS

(71) Applicant: SK hynix Inc., Gyeonggi-do (KR)

(72) Inventor: Hyun Min Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/638,628

(22) Filed: Mar. 4, 2015

(30) Foreign Application Priority Data

Nov. 18, 2014 (KR) .......................... 10-2014-0160784

(51) Int. Cl.
*G11C 13/00* (2006.01)

(52) U.S. Cl.
CPC .......... *G11C 13/004* (2013.01); *G11C 13/0038* (2013.01); *G11C 13/0069* (2013.01)

(58) Field of Classification Search
CPC ............. G11C 13/004; G11C 13/0038; G11C 13/0069
USPC ............... 365/148, 158, 163, 189.05, 189.11, 365/230.06
See application file for complete search history.

(56) References Cited

U.S. PATENT DOCUMENTS

2012/0275212 A1* 11/2012 Jung ........................ G11C 7/06
365/148

FOREIGN PATENT DOCUMENTS

KR 1020130107308 10/2013

* cited by examiner

*Primary Examiner* — Tan T. Nguyen
(74) *Attorney, Agent, or Firm* — IP & T Group LLP

(57) ABSTRACT

A semiconductor apparatus includes first and second variable resistors, a variable resistor selection unit and a threshold voltage adjustment unit. The variable resistor selection unit includes a plurality of transistors suitable for electrically coupling each of the first and second variable resistors to a sense amplifier in response to resistor selection signals. The threshold voltage adjustment unit provides a first voltage to bulks of the plurality of transistors during a read operation, and a second voltage that is different than the first voltage to the bulks of the plurality of transistors during operations other than the read operation.

20 Claims, 4 Drawing Sheets

140A

140B

SEMICONDUCTOR APPARATUS

CROSS-REFERENCES TO RELATED APPLICATION

The present application claims priority under 35 U.S.C. §119(a) to Korean application number 10-2014-0160784, filed on Nov. 18, 2014 in the Korean Intellectual Property Office, which is incorporated herein by reference in its entirety as set forth in full.

BACKGROUND

1. Technical Field

Various embodiments relate to a semiconductor apparatus and, more particularly, to a semiconductor apparatus capable of reading data stored in a resistor or a cell.

2. Related Art

A transistor may be used in various ways in an electronic apparatus such as a semiconductor device. Each transistor has a gate, a drain, and a source, and allows current to flow through a channel that is formed between the drain and the source when a voltage higher than its threshold voltage is applied to the gate. Transistors are generally classified into N-channel metal oxide semiconductor (NMOS) transistors and P-channel MOS (PMOS) transistors. The NMOS transistors have difficulty transferring high voltages while PMOS transistors have difficulty transferring low voltages.

Even though transistors are widely used as switching devices in electronic apparatus, both NMOS transistors and PMOS transistors have difficulty in transferring both high and low voltages. Particularly, when an NMOS transistor is coupled between a power supply voltage and a ground voltage, the NMOS transistor transfers a voltage that is dropped from the power supply voltage by the threshold voltage. Therefore, the NMOS transistor is not adequate for a switching device that needs to transfer information that is sensitive to voltage or current magnitude. One possible embodiment for transferring high voltage through an NMOS transistor is to apply an even higher voltage to the gate of the NMOS transistor. However, this embodiment requires additional circuitry to generate the voltage applied to the gate of the NMOS transistor, which is higher than the general power supply voltage, and thus requires additional space in the electronic apparatus.

SUMMARY

In an embodiment of the present invention, a semiconductor apparatus may include: first and second variable resistors; a variable resistor selection unit including a plurality of transistors suitable for electrically coupling each of the first and second variable resistors to a sense amplifier in response to resistor selection signals; and a threshold voltage adjustment unit suitable for providing a first voltage to bulks of the plurality of transistors during a read operation, and a second voltage different from the first voltage to the bulks of the plurality of transistors during operations other than the read operation.

In an embodiment of the present invention, a semiconductor apparatus may include: a column selection unit suitable for electrically coupling a bit line, which is coupled to a memory cell, to a sense amplifier in response to a column selection signal; and a threshold voltage adjustment unit suitable for providing one of a first voltage and a second voltage different from the first voltage as a bulk bias voltage of the column selection unit in response to a read signal.

In an embodiment of the present invention, a semiconductor apparatus may include: a memory block including a plurality of memory cells; a column selection unit coupled between a sense amplifier and the plurality of memory cells, suitable for selecting one of a plurality of bit lines, which are respectively coupled to the plurality of memory cells, in response to column selection signals; and a threshold voltage adjustment unit suitable for providing a first voltage as a bulk bias voltage of the column selection unit during a read operation, and a second voltage different from the first voltage as the bulk bias voltage of the column selection unit during operations except for the read operation.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to the present invention will be described with reference to the accompanying drawings through exemplary embodiments.

In accordance with an exemplary embodiment of the present disclosure, the semiconductor apparatus may adjust a threshold voltage of a transistor by controlling a bulk bias voltage of the transistor according to an operation thereof.

Figure 1:
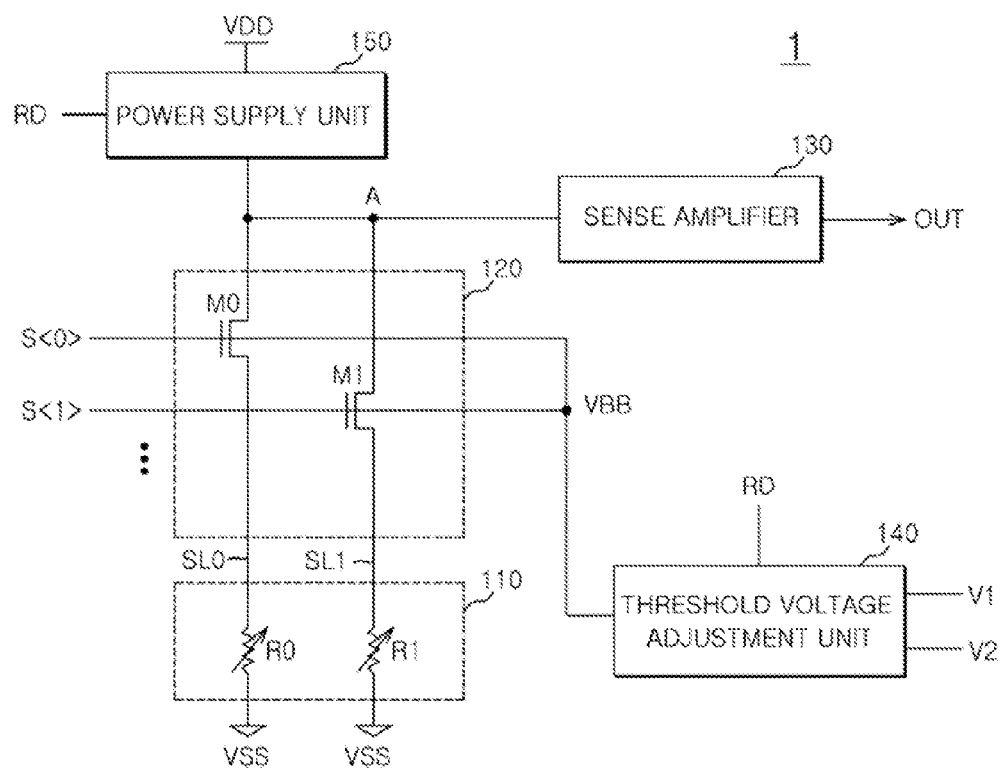
FIG. 1 is a circuit diagram illustrating a semiconductor apparatus in accordance with an exemplary embodiment of the present disclosure.

FIG. 1 is a circuit diagram illustrating a semiconductor apparatus 1 in accordance with an exemplary embodiment of the present disclosure.

Referring to FIG. 1, the semiconductor apparatus 1 in accordance with the exemplary embodiment of the present disclosure may include a variable resistor unit 110, a variable resistor selection unit 120, a sense amplifier 130, and a threshold voltage adjustment unit 140.

The variable resistor unit 110 may include a plurality of variable resistors. Each of the plurality of variable resistors may store information therein, and have a resistance corresponding to the information stored therein. Referring to FIG. 1, the variable resistor unit 110 may include first and second variable resistors R0 and R1. Even though FIG. 1 exemplarily shows the variable resistor unit 110 including 2 variable resistors, the variable resistor unit 110 may include more variable resistors in an array. Each of the first and second variable resistors R0 and R1 may have a first terminal coupled to a ground voltage (VSS) terminal, and a second terminal coupled to the variable resistor selection unit 120 through a corresponding one of resistor selection lines SL0 and SL1. Referring to FIG. 1, the first variable resistor R0 may be coupled to a first resistor selection line SL0, and the second variable resistor R1 may be coupled to a second resistor selection line SL1.

Each of the first and second variable resistors R0 and R1 may include a variable resistor device. The variable resistor device may have a resistance which is variable according to one or more conditions including temperature, electromagnetic field direction, voltage and current. Each of the first and second variable resistors R0 and R1 may have a particular resistance according to the information stored therein. Each resistance of the first and second variable resistors R0 and R1 may be set by a resister circuit for storing the information into each of the first and second variable resistors R0 and R1.

The variable resistor selection unit 120 may select one of the first and second resistor selection lines SL0 and SL1 in response to resistor selection signals S<0:1>. The variable resistor selection unit 120 may be coupled between the variable resistor unit 110 and the sense amplifier 130. The variable resistor selection unit 120 may be coupled to the first and second variable resistors R0 and R1 of the variable resistor unit 110 through the first and second resistor selection lines SL0 and SL1, respectively. The variable resistor selection unit 120 may include a plurality of transistors, the number of which corresponds to the number of resistor selection lines.

Each of the plurality of transistors may be a pass transistor, and may include an NMOS transistor. As the threshold voltage of the transistor decreases, the voltage transferred through the transistor increases, thereby increasing the amount of current flowing through the transistor. Therefore, sensing margin of the sense amplifier 130 that receives the voltage or the current from the variable resistor selection unit 120 may be secured.

The variable resistor selection unit 120 may include a first transistor M0 and a second transistor M1. Even though FIG. 1 exemplarily shows the variable resistor selection unit 120 including 2 transistors respectively corresponding to 2 variable resistors of the variable resistor unit 110, the number of transistors included in the variable resistor selection unit 120 is not limited to what is shown in FIG. 1. The first transistor M0 may have a gate receiving the first resistor selection signal S<0>, a source coupled to the second terminal of the first variable resistor R0, and a drain coupled to a node A. The second transistor M1 may have a gate receiving the second resistor selection signal S<1>, a source coupled to the second terminal of the second variable resistor R1, and a drain coupled to the node A.

The resistor selection signals S<0:1> may be enabled for selecting one to be accessed between the first and second variable resistors R0 and R1. When the first resistor selection signal S<0> is enabled, the first transistor M0 may be electrically coupled to the first variable resistor R0 through the first resistor selection line SL0. When the second resistor selection signal S<1> is enabled, the second transistor M1 may be electrically coupled to the second variable resistor R1 through the second resistor selection line SL1.

When a particular resistor selection line is selected in response to the resistor selection signals S<0:1>, the sense amplifier 130 may generate an output signal OUT by sensing and amplifying information stored in the variable resistor coupled to the selected resistor selection line. The sense amplifier 130 may be coupled to the node A, and the first and second variable resistors R0 and R1 may be coupled to the sense amplifier 130 through the first and second transistors M0 and M1 of the variable resistor selection unit 120. Therefore, the sense amplifier 130 may be coupled to a particular variable resistor through the variable resistor selection unit 120, and may generate the output signal OUT by sensing and amplifying the information stored in the first and second variable resistors R0 and R1 transferred through the first and second resistor selection lines SL0 and SL1. The sense amplifier 130 may include an analog to digital converter (ADC) suitable for generating a digital signal by sensing current flowing on the node A, or include a voltage amplifier suitable for generating a digital signal by comparing between a reference voltage and a voltage at the node A.

The threshold voltage adjustment unit 140 may adjust threshold voltages of the first and second transistors M0 and M1 of the variable resistor selection unit 120 according to an operation of the semiconductor apparatus 1. The semiconductor apparatus 1 may perform operations in various modes. For example, the semiconductor apparatus 1 may perform operations in an active mode, a stand-by mode, a power-down mode or a sleep mode, and so forth, and may perform a write operation and a read operation during the active mode. The semiconductor apparatus 1 may perform the write operation by changing the resistances of the first and second variable resistors R0 and R1 of the variable resistor unit 110 and storing particular information into the first and second variable resistors R0 and R1. The semiconductor apparatus 1 may perform the read operation by reading information stored in the first and second variable resistors R0 and R1 of the variable resistor unit 110. A read signal RD may be enabled while the semiconductor apparatus 1 reads the information stored in the first and second variable resistors R0 and R1.

The threshold voltage adjustment unit 140 may provide one of first and second voltages V1 and V2 to bulks of the first and second transistors M0 and M1 of the variable resistor selection unit 120 in response to the read signal RD. The levels of the first and second voltages V1 and V2 may be different from each other. For example, the first voltage V1 may be higher than the second voltage V2. The threshold voltage adjustment unit 140 may provide the first voltage V1 as a bulk bias voltage VBB of the variable resistor selection unit 120 during the read operation, and the second voltage V2 as the bulk bias voltage of the variable resistor selection unit 120 during the operations other than the read operation. In an exemplary embodiment of the present disclosure, the first and second transistors M0 and M1 of the variable resistor selection unit 120 may be formed in a single well. Therefore, the first and second transistors M0 and M1 may receive the bulk bias voltage VBB, which is adjusted by the threshold voltage adjustment unit 140, at the same time.

Referring to FIG. 1, the semiconductor apparatus 1 may further include a power supply unit 150. The power supply unit 150 may supply voltages required for the operations of the semiconductor apparatus 1, and may supply an external power voltage VDD to node A in response to the read signal RD. When the power supply unit 150 supplies the external power voltage VDD to node A, the external power voltage VDD may be supplied to one of the first and second variable resistors R0 and R1 selected by the variable resistor selection unit 120. When the external power voltage VDD is supplied to the selected one of the first and second variable resistors R0 and R1, current may flow through the node A and the amount of the current may vary according to the resistance of the selected one of the first and second variable resistors R0 and R1. Also, the voltage level of node A may vary according to the resistance of the selected one of the first and second variable resistors R0 and R1.

The power supply unit 150 may supply the external power voltage VDD to node A in response to the read signal RD, and the external power voltage VDD may be supplied to the selected one of the first and second variable resistors R0 and R1 through the first and second transistors M0 and M1 of the variable resistor selection unit 120 coupled to the node A. As described above, the first and second transistors M0 and M1 may receive the first and second resistor selection signals S<0:1> at their gates, and may be coupled to the first and second variable resistors R0 and R1 through the first and second resistor selection lines SL0 and SL1, respectively. Also, the bulks of the first and second transistors M0 and M1 may be coupled to the threshold voltage adjustment unit 140. Each threshold voltage of the first and second transistors M0 and M1 may be determined by a voltage level difference between the gate and the source, and may be adjusted by the bulk bias voltage VBB, which is applied to the bulks of the first and second transistors M0 and M1.

In accordance with an exemplary embodiment of the present disclosure, the threshold voltage adjustment unit 140 may lower the threshold voltages of the first and second transistors M0 and M1 by providing the first voltage V1 higher than the second voltage V2, instead of the second voltage V2, as the bulk bias voltage VBB of the first and second transistors M0 and M1 during the read operation of the semiconductor apparatus 1. Therefore, the threshold voltage adjustment unit 140 may allow the external power voltage VDD to be transferred without loss from the power supply unit 150 to the first and second variable resistors R0 and R1 through the first and second transistors M0 and M1. As a result, current may flow through node A according to the resistances of the first and second variable resistors R0 and R1.

Figure 2A:
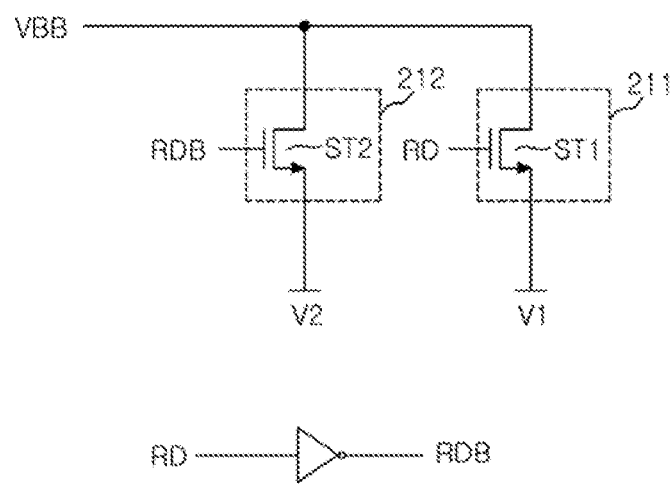
FIG. 2A is a circuit diagram illustrating an exemplary embodiment of a threshold voltage adjustment unit shown in FIG. 1.

FIG. 2A is a circuit diagram illustrating an exemplary embodiment of the threshold voltage adjustment unit 140 shown in FIG. 1.

The threshold voltage adjustment unit 140A may provide one of the first voltage V1 and the second voltage V2 as the bulk bias voltage VBB according to the operation of the semiconductor apparatus 1.

Referring to FIG. 2A, the threshold voltage adjustment unit 140A may include a first voltage output section 211 and a second voltage output section 212. During the read operation, the first voltage output section 211 may output the first voltage V1 as the bulk bias voltage VBB in response to the read signal RD. During the operations other than the read operation, the second voltage output section 212 may output the second voltage V2 as the bulk bias voltage VBB in response to an inverted signal RDB of the read signal RD. The first voltage output section 211 may include a first switching transistor ST1, and the second voltage output section 212 may include a second switching transistor ST2. The first switching transistor ST1 may include a gate receiving the read signal RD, a source receiving the first voltage V1, and a drain coupled to a node for outputting the bulk bias voltage VBB. The second switching transistor ST2 may include a gate receiving the inverted signal RDB of the read signal RD, a source receiving the second voltage V2, and a drain coupled to the node for outputting the bulk bias voltage VBB.

Figure 2B:
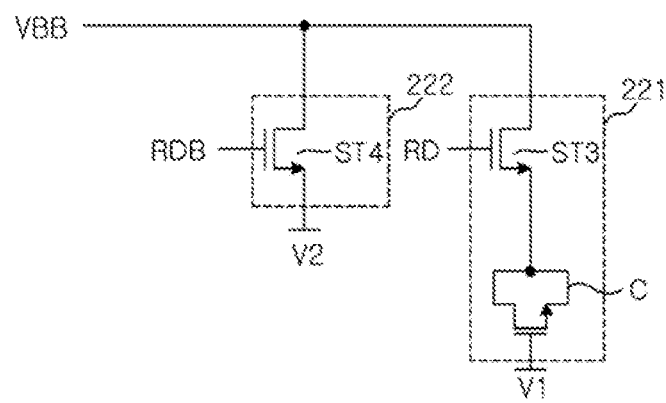
FIG. 2B is a circuit diagram illustrating an exemplary embodiment of a threshold voltage adjustment unit shown in FIG. 1.

FIG. 2B is a circuit diagram illustrating an exemplary embodiment of the threshold voltage adjustment unit 140 shown in FIG. 1.

Referring to FIG. 2B, the threshold voltage adjustment unit 140B may include a third voltage output section 221 and a fourth voltage output section 222. When the read signal RD is enabled, the third voltage output section 221 may output the first voltage V1 as the bulk bias voltage VBB in response to the read signal RD. When the read signal RD is disabled, the fourth voltage output section 222 may output the second voltage V2 as the bulk bias voltage VBB in response to the inverted signal RDB of the read signal RD.

The third voltage output section 221 may include a third switching transistor ST3 and a capacitor C. The capacitor C may include a first terminal receiving the first voltage V1 and a second terminal coupled to the third switching transistor ST3. The third switching transistor ST3 may include a gate receiving the read signal RD, a source coupled to the second terminal of the capacitor C, and a drain coupled to a node for outputting the bulk bias voltage VBB. Compared with the first voltage output section 211 of FIG. 2A, the third voltage output section 221 may further include the capacitor C to provide the first voltage V1, which has a stable voltage level, as the bulk bias voltage VBB.

The fourth voltage output section 222 may include a fourth switching transistor ST4. The fourth switching transistor ST4 may include a gate receiving the inverted signal RDB of the read signal RD, a source receiving the second voltage V2, and a drain coupled to the node for outputting the bulk bias voltage VBB.

Figure 3:
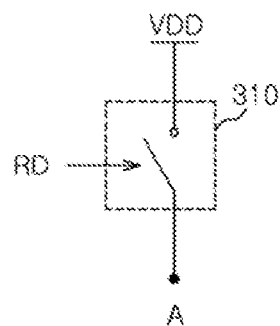
FIG. 3 is a circuit diagram illustrating an exemplary embodiment of a power supply unit shown in FIG. 1.

FIG. 3 is a circuit diagram illustrating an exemplary embodiment of the power supply unit 150 shown in FIG. 1.

The power supply unit 150 may supply the external power voltage VDD to the node A during the read operation on the first and second variable resistors R0 and R1. The power supply unit 150 may supply the external power voltage VDD to node A in response to the read signal RD.

Referring to FIG. 3, the power supply unit 150 may include a switch 310. The switch 310 may provide the external power voltage VDD to node A in response to the read signal RD. In accordance with an exemplary embodiment of the present disclosure, the switch 310 may include a PMOS transistor.

Figure 4:
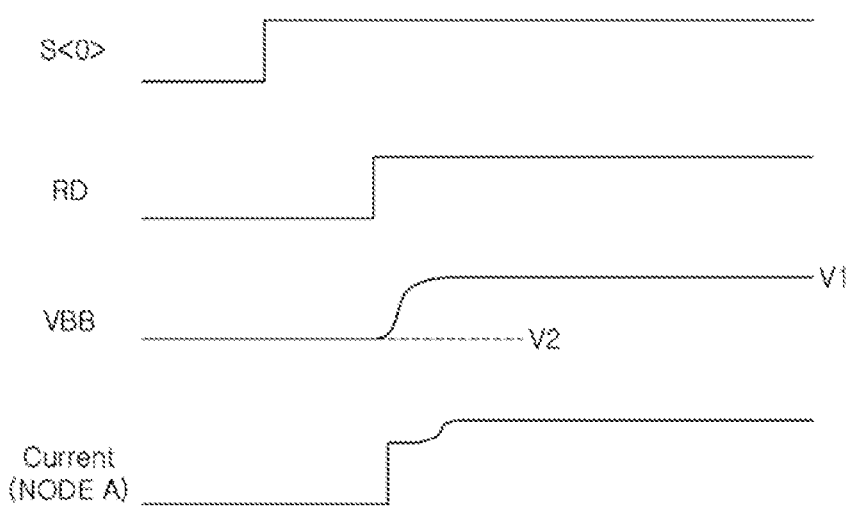
FIG. 4 is a timing diagram illustrating an operation of a semiconductor apparatus in accordance with an exemplary embodiment of the present disclosure.

FIG. 4 is a timing diagram illustrating an operation of the semiconductor apparatus 1 in accordance with an exemplary embodiment of the present disclosure.

The operation of the semiconductor apparatus 1 will be described with reference to FIGS. 1 to 4.

During the read operation of the semiconductor apparatus 1, the first resistor selection signal S<0> may be enabled to read the information stored in the first variable resistor R0 of the variable resistor unit 110. When the first resistor selection signal S<0> is enabled, the first transistor M0 of the variable resistor selection unit 120 may be turned on so that node A may be electrically coupled to the first variable resistor R0 through the first resistor selection line SL0. Then, when the read signal RD is enabled for reading the information stored in the first variable resistor R0, the power supply unit 150 may supply the external power voltage VDD to node A. Since the first transistor M0 is turned on, the external power voltage VDD at node A may be supplied to the first variable resistor R0 through the first transistor M0 of the variable resistor selection unit 120. At this time, the first transistor M0 may transfer the voltage, which is dropped from the external power voltage VDD by the threshold voltage of the first transistor M0, to the first variable resistor R0. When the external power voltage VDD is supplied to the first variable resistor R0 through the first transistor M0, current may flow from node A to the VSS terminal according to the resistance of the first variable resistor R0. For adjusting the threshold voltage of the first transistor M0, the threshold voltage adjustment unit 140 may provide the first voltage V1, higher than the second voltage V2, as the bulk bias voltage VBB of the variable resistor selection unit 120, in response to the read signal RD. When the first voltage V1 is provided as the bulk bias voltage VBB of the first transistor M0, the threshold voltage of the first transistor M0 may be lowered. As a result, the level of the voltage supplied to the first variable resistor R0 through the first transistor M0 may be raised. Therefore, the amount of current flowing to node A through the first transistor M0 may increase. The sense amplifier 130 may sense the resistance of the first variable resistor R0 by sensing the amount of the current flowing through node A or the voltage level of node A.

Figure 5:
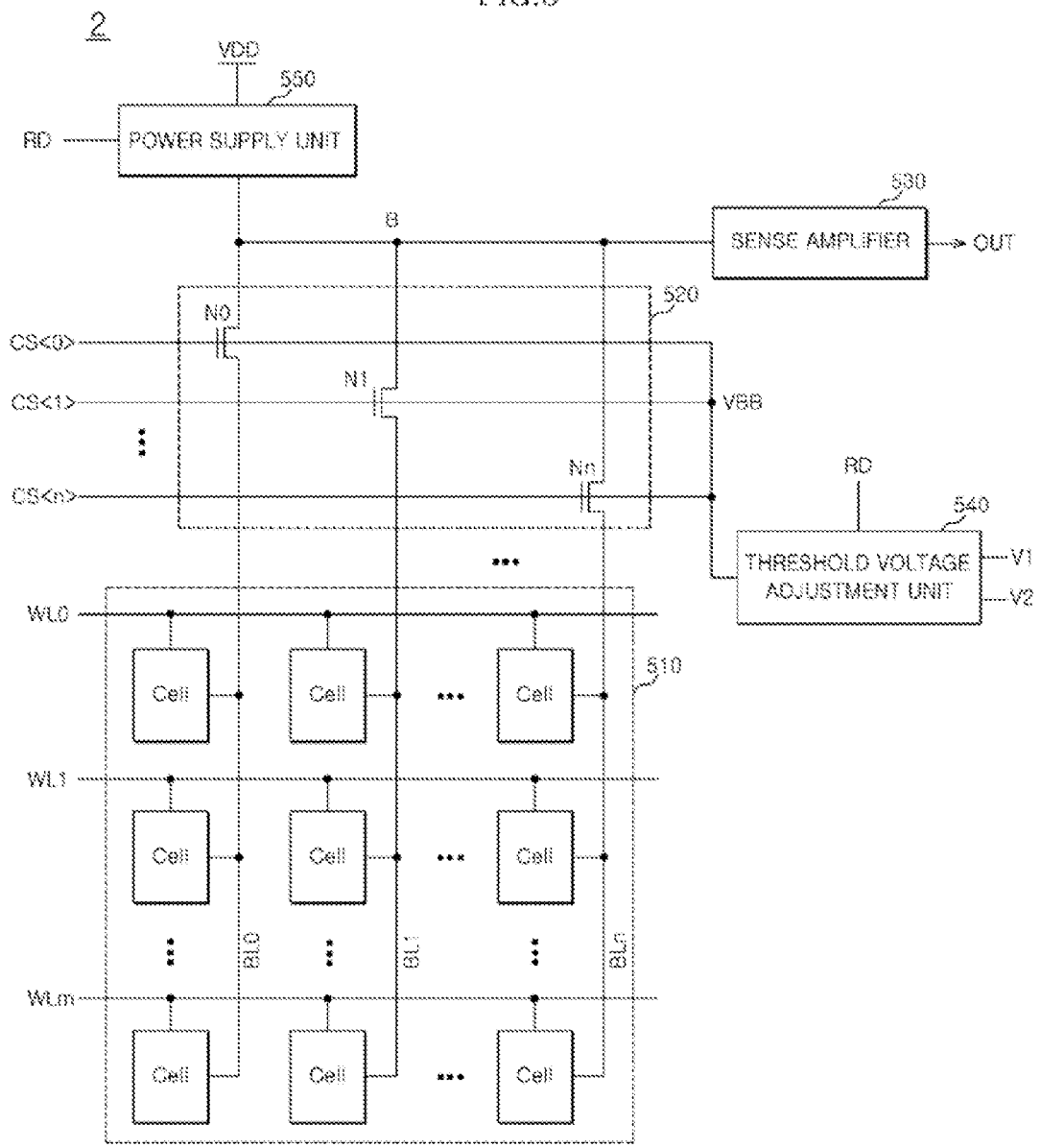
FIG. 5 is a circuit diagram illustrating a semiconductor apparatus in accordance with an exemplary embodiment of the present disclosure.

FIG. 5 is a circuit diagram illustrating a semiconductor apparatus 2 in accordance with an exemplary embodiment of the present disclosure.

Referring to FIG. 5, the semiconductor apparatus 2 may be a memory device configured to store and output data. The semiconductor apparatus 2 in accordance with an exemplary embodiment of the present disclosure may include a memory block 510, a column selection unit 520, a sense amplifier 530, and a threshold voltage adjustment unit 540.

The memory block 510 may include a plurality of word lines WL<0:$m$>, a plurality of bit lines BL<0:$n$> and a plurality of memory cells, n and m being a positive integer. The memory block 510 may be provided in the form of array, the plurality of word lines WL<0:$m$> may be disposed in the row direction, and the plurality of bit lines BL<0:$n$> may be disposed in the column direction. The plurality of memory cells may be disposed at cross points of the plurality of word lines WL<0:$m$> and the plurality of bit lines BL<0:$n$>. Therefore, a particular memory cell may be accessed by selecting one of the plurality of word lines WL<0:$m$> and one of the plurality of bit lines BL<0:$n$>.

The semiconductor apparatus 2 may be a volatile memory device, or preferably a non-volatile memory device. For example, the semiconductor apparatus 2 may include a flash memory device, a resistive random access memory (RRAM) device, a phase-change random access memory (PRAM) device, a ferroelectric random access memory (FRAM) device, a spin transfer torque random access memory (STT-RAM) device, and so forth.

The memory cell may be a flash memory cell including a floating gate, or an electrically erasable programmable read-only memory (EEPROM) memory cell. Further, the memory cell may include a RRAM cell, a PRAM cell, a FRAM cell, a STT-RAM cell, and so forth.

The column selection unit 520 may select one of the plurality of bit lines BL<0:$n$> in response to column selection signals CS<0:$n$>. The column selection unit 520 may be coupled between the memory block 510 and the sense amplifier 530, and may be coupled to each of the plurality of memory cells through the plurality of bit lines BL<0:$n$>. The column selection unit 520 may include a plurality of transistors N0 to Nn, the number of which corresponds to the number of bit lines BL<0:$n$>.

Each of the plurality of transistors N0 to Nn may be a pass transistor, and may include an NMOS transistor. As the threshold voltage of the transistor decreases, the voltage level transferred through the transistor increases, thereby increasing the amount of current flowing through the transistor. Therefore, the sensing margin of the sense amplifier 530 receiving the voltage or the current from the column selection unit 520 may be secured.

The first transistor N0 of the plurality of transistors N0 to Nn may include a gate receiving the first column selection signal CS<0>, a source coupled to the respective memory cells, and a drain coupled to a node B. The second transistor N1 may include a gate receiving the second column selection signal CS<1>, a source coupled to the respective memory cells, and a drain coupled to the node B.

In a state where any of the word lines WL<0:$m$> are selected, the column selection signals CS<0:$n$> may be enabled for selecting one of the plurality of memory cells. When the first column selection signal CS<0> is enabled in a state where any of the word lines WL<0:$m$> are selected, the first transistor N0 may be electrically coupled to a memory cell which is disposed at a cross point of the selected word line and the first bit line BL0. When the second column selection signal CS<1> is enabled in a state where any of the word lines WL<0:$m$> are selected, the second transistor N1 may be electrically coupled to a memory cell which is disposed at a cross point of the selected word line and the second bit line BL1. Therefore, when the (n+1)th column selection signal CS<n> is enabled in a state where any of the word lines WL<0:$m$> are selected, the (n+1)th transistor Nn may be electrically coupled to a memory cell which is disposed at a cross point of the selected word line and the (n+1)th bit line BLn.

When a particular bit line is selected in response to the column selection signals CS<0:$n$> in a state where any of the word lines WL<0:$m$> are selected, the sense amplifier 530 may generate an output signal OUT by sensing and amplifying information stored in the memory cell disposed at a cross point of the selected word line and the selected bit line. The sense amplifier 530 may be coupled to the node B, and the plurality of memory cells may be coupled to the sense amplifier 530 through the plurality of transistors N0 to Nn of the column selection unit 520. Therefore, the sense amplifier 530 may be coupled to a particular memory cell through the column selection unit 520, and may generate the output signal OUT by sensing and amplifying the information stored in the plurality of memory cells transferred through the plurality of bit lines BL<0:$n$>. The sense amplifier 530 may include an analog to digital converter (ADC) suitable for generating a digital signal by sensing current flowing through the node B, or include a voltage amplifier suitable for generating a digital signal by comparing levels between a reference voltage and a voltage at the node B.

The threshold voltage adjustment unit 540 may adjust threshold voltages of the plurality of transistors N0 to Nn of the column selection unit 520 according to an operation of the semiconductor apparatus 2. The semiconductor apparatus 2 may perform operations in various modes. For example, the semiconductor apparatus 2 may perform operations in an active mode, a stand-by mode, a power-down mode or a sleep mode, and so forth, and may perform a write operation and a read operation during the active mode. The semiconductor apparatus 2 may perform the write operation by storing particular information into the plurality of memory cells of the memory block 510. The semiconductor apparatus 2 may perform the read operation by reading information stored in the plurality of memory cells. A read signal RD may be enabled while the semiconductor apparatus 2 reads the information stored in the plurality of memory cells.

The threshold voltage adjustment unit 540 may provide one of first and second voltages V1 and V2 to bulks of the plurality of transistors N0 to Nn of the column selection unit 520 in response to the read signal RD. The levels of the first and second voltages V1 and V2 may be different from each other. For example, the first voltage V1 may be higher than the second voltage V2. The threshold voltage adjustment unit 540 may provide the first voltage V1 as a bulk bias voltage VBB of the column selection unit 520 during the read operation, and the second voltage V2 as the bulk bias voltage of the column selection unit 520 during the operations except for the read operation. In an exemplary embodiment of the present disclosure, the plurality of transistors N0 to Nn of the column selection unit 520 may be formed in a single well. Therefore, the plurality of transistors N0 to Nn may receive the bulk bias voltage VBB, which is adjusted by the threshold voltage adjustment unit 540, at the same time.

Referring to FIG. 5, the semiconductor apparatus 2 may further include a power supply unit 550. The power supply unit 550 may supply voltages required for the operations of the semiconductor apparatus 2, and may supply an external power voltage VDD to the node B in response to the read signal RD. When the power supply unit 550 supplies the external power voltage VDD to the node B, the external power voltage VDD may be supplied to one of the plurality of memory cells selected by the column selection unit 520. When the external power voltage VDD is supplied to the selected one of the plurality of memory cells, current may flow on the node B and an amount of the current may be variable according to the information stored in the selected one of the plurality of memory cells. Also, a voltage level of the node B may be variable according to the information stored in the selected one of the plurality of memory cells.

The power supply unit 550 may supply the external power voltage VDD to the node B in response to the read signal RD, and the external power voltage VDD may be supplied to the selected one of the plurality of memory cells through the plurality of transistors N0 to Nn of the column selection unit 520 coupled to the node B. As described above, the plurality of transistors N0 to Nn may receive the column selection signals CS<0:$n$> at their gates, and may be coupled to the plurality of memory cells through the plurality of bit lines BL<0:$n$>, respectively. Also, the bulks of the plurality of transistors N0 to Nn may be coupled to the threshold voltage adjustment unit 540. Each threshold voltage of the plurality of transistors N0 to Nn may be determined by a voltage level difference between the gate and the source, and may be adjusted by the bulk bias voltage VBB, which is applied to the bulks of the plurality of transistors N0 to Nn.

In accordance with an exemplary embodiment of the present disclosure, the threshold voltage adjustment unit 540 may lower the threshold voltages of the plurality of transistors N0 to Nn by providing the first voltage V1, which is higher than the second voltage V2, instead of the second voltage V2, as the bulk bias voltage VBB of the plurality of transistors N0 to Nn during the read operation of the semiconductor apparatus 2. Therefore, the threshold voltage adjustment unit 540 may allow the external power voltage VDD to be transferred without loss from the power supply unit 550 to the plurality of memory cells through the plurality of transistors N0 to Nn. As a result, the current may flow through node B according to the information stored in the plurality of memory cells.

While certain embodiments have been described above, it will be understood to those skilled in the art that the embodiments described are by way of example only. Accordingly, the semiconductor apparatus for reading information stored in a resistor or a cell should not be limited based on the described embodiments. Rather, the semiconductor apparatus for reading information stored in resistors or cells, as described herein, should only be limited in light of the claims that follow when taken in conjunction with the above description and accompanying drawings.

What is claimed is:

1. A semiconductor apparatus comprising:
a first variable resistor;
a second variable resistor;
a variable resistor selection unit including a plurality of transistors suitable for electrically coupling each of the first and second variable resistors to a sense amplifier in response to resistor selection signals; and
a threshold voltage adjustment unit suitable for providing a first voltage to bulks of the plurality of transistors during a read operation, and a second voltage, which is different than the first voltage, to the bulks of the plurality of transistors during operations other than the read operation.

2. The semiconductor apparatus of claim 1, wherein the plurality of transistors includes first and second transistors, and
wherein the first transistor has a gate receiving a first resistor selection signal, a source coupled to the first variable resistor, a drain coupled to the sense amplifier, and the second transistor has a gate receiving a second resistor selection signal, a source coupled to the second variable resistor, and a drain coupled to the sense amplifier.

3. The semiconductor apparatus of claim 1, wherein the plurality of transistors includes an N-channel transistor.

4. The semiconductor apparatus of claim 1, wherein the threshold voltage adjustment unit includes:
a first voltage output section suitable for outputting the first voltage during the read operation; and
a second voltage output section suitable for outputting the second voltage during the operations other than the read operation.

5. The semiconductor apparatus of claim 4, wherein the threshold voltage adjustment unit further includes:
a capacitor including a first terminal receiving the first voltage and a second terminal coupled to the first voltage output section.

6. The semiconductor apparatus of claim 1, wherein the first voltage is higher than the second voltage.

7. The semiconductor apparatus of claim 1, further comprising:
a power supply unit coupled to a node between the sense amplifier and the plurality of transistors, and suitable for supplying an external power voltage to the node during the read operation.

8. A semiconductor apparatus comprising:
a column selection unit suitable for electrically coupling a bit line, which is coupled to a memory cell, to a sense amplifier in response to a column selection signal; and
a threshold voltage adjustment unit suitable for providing one of a first voltage and a second voltage, which is different from the first voltage, as a bulk bias voltage of the column selection unit in response to a read signal.

9. The semiconductor apparatus of claim 8, wherein the column selection unit includes a transistor that has a gate receiving the column selection signal, a source coupled to the memory cell, and a drain coupled to the sense amplifier.

10. The semiconductor apparatus of claim 9, wherein the transistor includes an N-channel transistor.

11. The semiconductor apparatus of claim 8, wherein the threshold voltage adjustment unit includes:
a first voltage output section suitable for outputting the first voltage in response to the read signal; and
a second voltage output section suitable for outputting the second voltage in response to an inverted signal of the read signal.

12. The semiconductor apparatus of claim 11, wherein the threshold voltage adjustment unit further includes:
a capacitor including a first terminal receiving the first voltage and a second terminal coupled to the first voltage output section.

13. The semiconductor apparatus of claim 8, wherein the first voltage is higher than the second voltage.

14. The semiconductor apparatus of claim 8, further comprising:
- a power supply unit coupled to a node between the sense amplifier and the column selection unit, and suitable for supplying an external power voltage to the node in response to the read signal.

15. A semiconductor apparatus comprising:
- a memory block including a plurality of memory cells;
- a column selection unit coupled between a sense amplifier and the plurality of memory cells, and suitable for selecting one of a plurality of bit lines, which are respectively coupled to the plurality of memory cells, in response to column selection signals; and
- a threshold voltage adjustment unit suitable for providing a first voltage as a bulk bias voltage of the column selection unit during a read operation, and a second voltage, which is different than the first voltage, as the bulk bias voltage of the column selection unit during operations other than the read operation.

16. The semiconductor apparatus of claim 15, wherein the column selection unit includes a plurality of transistors, and
    wherein each of the plurality of transistors has a gate receiving an assigned one of the column selection signals, a source coupled to an assigned one of the plurality of memory cells, and a drain coupled to the sense amplifier.

17. The semiconductor apparatus of claim 16, wherein the plurality of transistors includes an N-channel transistor.

18. The semiconductor apparatus of claim 15, wherein the threshold voltage adjustment unit includes:
- a first voltage output section suitable for outputting the first voltage during the read operation; and
- a second voltage output section suitable for outputting the second voltage during the operations other than the read operation.

19. The semiconductor apparatus of claim 15, wherein the first voltage is higher than the second voltage.

20. The semiconductor apparatus of claim 15, further comprising:
- a power supply unit coupled to a node between the sense amplifier and the column selection unit, and suitable for supplying an external power voltage to the node during the read operation.

\* \* \* \* \*